(12) United States Patent
Park et al.

(10) Patent No.: US 7,320,906 B2
(45) Date of Patent: Jan. 22, 2008

(54) THIN FILM TRANSISTOR ARRAY PANEL AND MANUFACTURING METHOD THEREOF

(75) Inventors: Min-Wook Park, Yongin-si (KR); Bum-Ki Baek, Suwonsi (KR); Jeong-Young Lee, Yongin-si (KR); Kwon-Young Choi, Goyang-si (KR); Sang-Ki Kwak, Suwon-si (KR); Sang-Jin Jeon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 357 days.

(21) Appl. No.: 10/922,343

(22) Filed: Aug. 19, 2004

(65) Prior Publication Data

US 2005/0110014 A1 May 26, 2005

(30) Foreign Application Priority Data

Aug. 19, 2003 (KR) .................. 10-2003-0057295

(51) Int. Cl.
*H01L 21/84* (2006.01)
(52) U.S. Cl. ................. 438/158; 438/708; 438/E21.017
(58) Field of Classification Search ................. 438/158, 438/164, 701, 704, 708, 713, E21.017, E21.309
See application file for complete search history.

(56) References Cited

U.S. PATENT DOCUMENTS 6,287,899 B1 * 9/2001 Park et al. .................. 438/149
6,555,409 B2 * 4/2003 Kim et al. .................. 438/34
7,023,016 B2 * 4/2006 Lee et al. .................. 257/59
2006/0209223 A1 * 9/2006 Choi et al. .................. 349/43
2006/0289965 A1 * 12/2006 Park et al. .................. 257/590

* cited by examiner

*Primary Examiner*—Minh-Loan Tran
(74) *Attorney, Agent, or Firm*—MacPherson Kwok Chen & Heid LLP

(57) ABSTRACT

A method of manufacturing a thin film transistor array panel is provided, which includes: forming a gate line on a substrate; depositing a gate insulating layer and a semiconductor layer in sequence on the gate line; depositing a lower conductive film and an upper conductive film on the semiconductor layer; photo-etching the upper conductive film, the lower conductive film, and the semiconductor layer; depositing a passivation layer; photo-etching the passivation layer to expose first and second portions of the upper conductive film; removing the first and the second portions of the upper conductive film to expose first and second portions of the lower conductive film; forming a pixel electrode on the first portion of the lower conductive film; removing the second portion of the lower conductive film to expose a portion of the semiconductor layer; and forming a columnar spacer on the exposed portion of the semiconductor layer.

18 Claims, 17 Drawing Sheets

THIN FILM TRANSISTOR ARRAY PANEL AND MANUFACTURING METHOD THEREOF

BACKGROUND OF THE INVENTION (a) Field of the Invention

The present invention relates to a thin film transistor array panel and a manufacturing method thereof.

(b) Description of the Related Art

A liquid crystal display (LCD) is one of the most widely used flat panel displays since it is lightweight and occupies less space than conventional cathode ray tube (CRT) displays. An LCD generally includes a liquid crystal (LC) layer that is interposed between a pair of panels including field-generating electrodes such as pixel electrodes and a common electrode. The LC layer is subjected to an electric field generated by the field-generating electrodes and variations in the field strength change the molecular orientation of the LC layer. For example, upon application of an electric field, the molecules of the LC layer change their orientation to change polarization of incident light. Appropriately arranged polarizers partially or fully block the light, creating gray or dark areas that can represent desired images.

One panel for the LCD generally includes a plurality of pixel electrodes, a plurality of thin film transistors (TFTs) for controlling signals to be applied to the pixel electrodes, a plurality of gate lines transmitting control signals for controlling the TFTs, and a plurality of data lines transmitting data voltages to be supplied to the pixel electrodes. The other panel generally includes a common electrode disposed on an entire surface thereof.

The TFT array panel including the TFTs includes several conductive films and insulting films. The gate lines, the data lines, and the pixel electrodes are formed of different films and they are separated by insulating films and sequentially arranged from bottom to top.

The TFT array panel is manufactured by several steps of film deposition and photolithography steps. Accordingly, it is important to obtain stable elements using a minimum process steps.

SUMMARY OF THE INVENTION

A motivation of the present invention is to solve the problems of the conventional art.

A method of manufacturing a thin film transistor array panel is provided, which includes: forming a gate line on a substrate; depositing a gate insulating layer and a semiconductor layer in sequence on the gate line; depositing a first conductive layer on the semiconductor layer; photo-etching the first conductive layer and the semiconductor layer; depositing a passivation layer; photo-etching the passivation layer to expose first and second portions of the first conductive layer; depositing a second conductive layer; and etching the second and the first conductive layers to form a pixel electrode on the first portion of the first conductive layer and to remove the second portion of the first conductive layer.

The etch of the second and the first conductive layers may include wet etch with an etchant.

The first and the second conductive layers may include Cr and IZO, respectively.

The first and the second conductive layers may include Al or Mo and ITO, respectively.

The first conductive layer may include a first film of Mo or Mo alloy and a second film of Al or Al alloy, and in particular, a lower film of Mo or Mo alloy, an intermediate film of Al or Al alloy, and an upper film of Mo or Mo alloy.

The photo-etching of the passivation layer exposes a third portion of the first conductive layer, and the etch of the second and the first conductive layers may form a contact assistant on the third portion of the first conductive layer.

The photo-etching of the passivation layer may etch the gate insulating layer to expose a portion of the gate line, and the etch of the second and the first conductive layers forms a contact assistant on the exposed portion of the gate line.

The gate line may include a lower film and an upper film, the photo-etching of the passivation layer may etch the gate insulating layer to expose a portion of the upper film of the gate line, and the method may further include: removing the exposed portion of the upper film of the gate line.

The etch of the second and the first conductive layers may expose a portion of the semiconductor layer and the method may further include: forming a columnar spacer covering the exposed portion of the semiconductor layer. The spacer may include organic or inorganic material.

The semiconductor layer may include an intrinsic film and an extrinsic film, and the method may further include: removing the exposed portion of the extrinsic film after removing the second portion of the first conductive layer.

A thin film transistor array panel is provided, which includes: a substrate; a gate line formed on the substrate and including a gate electrode; a gate insulating layer formed on the gate line; a semiconductor layer formed on the gate insulating layer; a plurality of ohmic contacts formed on the semiconductor layer; source and drain electrodes formed on the ohmic contacts; a passivation layer formed on the source and the drain electrodes and having a first contact hole exposing a portion of the drain electrode and a portion of the gate insulating layer adjacent thereto and an opening exposing a first portion of the semiconductor layer and having edges that coincide with edges of the source and the drain electrodes; and a pixel electrode formed on the passivation layer and contacting the drain electrode through the first contact hole.

The opening may have edges that coincide with edges of the ohmic contacts.

The source and drain electrodes may include Cr, and the pixel electrode may include IZO.

The source and drain electrodes may include Al or Mo, and the pixel electrode may include ITO.

The source and drain electrodes may include a lower film of Mo or Mo alloy, an intermediate film of Al or Al alloy, and an upper film of Mo or Mo alloy.

The gate line may include a lower film and an upper film, the lower film of the gate line may have a first portion exposed out of the upper film of the gate line, and the passivation layer may further have a second contact hole exposing the first portion of the lower film of the gate line.

The thin film transistor array panel may further include a contact assistant disposed on the first portion of the lower film of the gate line.

BRIEF DESCRIPTION OF THE DRAWINGS

The present invention will become more apparent by describing embodiments thereof in detail with reference to the accompanying drawings in which.

DETAILED DESCRIPTION OF EMBODIMENTS

Figure 1:
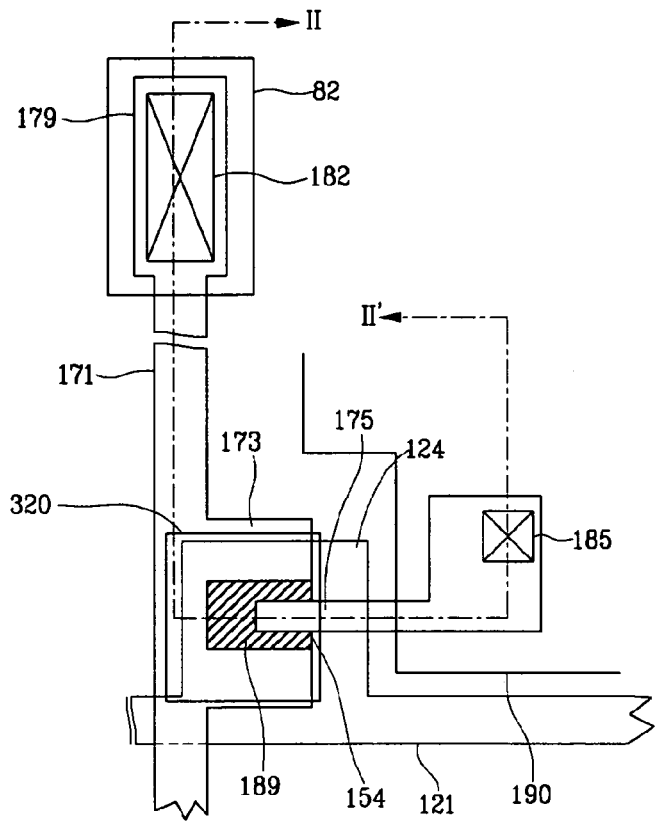
FIG. 1 is an exemplary layout view of a TFT array panel according to an embodiment of the present invention.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, TFT array panels and manufacturing methods thereof according to embodiments of the present invention will be described with reference to the accompanying drawings.

A TFT array panel for an LCD will be described in detail with reference to FIGS. 1 and 2.

Figure 2:
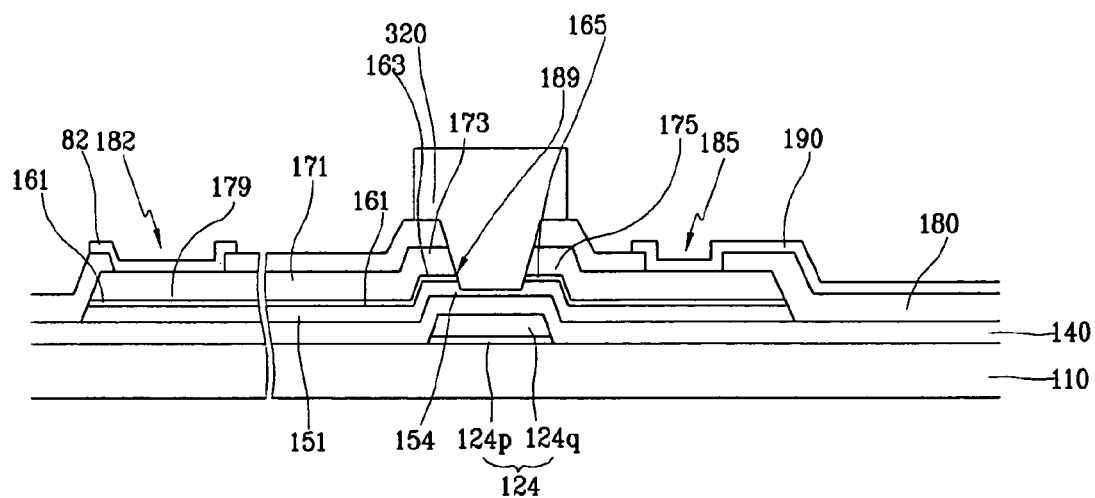
FIG. 2 is a sectional view of the TFT array panel shown in FIG. 1 taken along the lines II-II'.

FIG. 1 is an exemplary layout view of a TFT array panel according to an embodiment of the present invention, and FIG. 2 is a sectional view of the TFT array panel shown in FIG. 1 taken along the lines II-II'.

A plurality of gate lines 121 for transmitting gate signals are formed on an insulating substrate 110. Each gate line 121 extends substantially in a transverse direction and it includes a plurality of portions projecting downward to form a plurality of gate electrodes 124 and an expanded end portion 129 having a large area for contact with another layer or an external device.

The gate lines 121 include two films having different physical characteristics, a lower film and an upper film. The upper film is preferably made of low resistivity metal including Al containing metal such as Al and Al alloy for reducing signal delay or voltage drop in the gate lines 121. On the other hand, the lower film is preferably made of material such as Cr, Mo, Mo alloy such as MoW, Ta and Ti, which has good physical, chemical, and electrical contact characteristics with other materials such as indium tin oxide (ITO) and indium zinc oxide (IZO). Good examples of combination of the lower film material and the upper film material are Cr and Al and Cr and Al—Nd alloy. In FIG. 2, the lower and the upper films of the gate electrodes 124 are indicated by reference numerals 124$p$ and 124$q$, respectively.

In addition, the lateral sides of the gate lines 121 are inclined relative to a surface of the substrate 110, and the inclination angle thereof ranges about 30-80 degrees.

A gate insulating layer 140 preferably made of silicon nitride (SiNx) is formed on the gate lines 121.

A plurality of semiconductor stripes 151 preferably made of hydrogenated amorphous silicon (abbreviated to "a-Si") are formed on the gate insulating layer 140. Each semiconductor stripe 151 extends substantially in the longitudinal direction and has a plurality of projections 154 branched out toward the gate electrodes 124.

A plurality of ohmic contact stripes and islands 161 and 165 preferably made of silicide or n+ hydrogenated a-Si heavily doped with n type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to a surface of the substrate 110, and the inclination angles thereof are preferably in a range of about 30-80 degrees.

A plurality of data lines 171 and a plurality of drain electrodes 175 are formed on the ohmic contacts 161 and 165.

The data lines 171 for transmitting data voltages extend substantially in the longitudinal direction and intersect the gate lines 121. Each data line 171 includes an expansion 179 having a larger area for contact with another layer or an external device.

A plurality of branches of each data line 171, which project toward the drain electrodes 175, form a plurality of source electrodes 173. Each drain electrode 175 includes one end portion disposed on a gate electrode 124 and partially enclosed by a source electrode 173 and the other end portion having a large area for contact with another layer. A gate electrode 124, a source electrode 173, and a drain electrode 175 along with a projection 154 of a semiconductor stripe 151 form a TFT having a channel formed in the projection 154 disposed between the source electrode 173 and the drain electrode 175.

The data lines 171 and the drain electrodes 175 are preferably made of refractory metal such as Cr, Mo, Ti, Ta, and alloys thereof. However, the data lines 171 and the drain electrodes 175 may also include a lower film and an upper film located thereon. Good examples of combination of the lower film material and the upper film material are Cr and Al and Cr and Al—Nd alloy, which are etched under different etch conditions.

Like the gate lines 121, the data lines 171 and the drain electrodes 175 have tapered lateral sides relative to a surface of the substrate 110, and the inclination angles thereof range about 30-80 degrees.

The ohmic contacts 161 and 165 are interposed only between the underlying semiconductor stripes 151 and the overlying data lines 171 and the overlying drain electrodes 175 thereon and reduce the contact resistance therebetween. The semiconductor stripes 151 have almost the same planar shapes as the data lines 171 and the drain electrodes 175 as well as the underlying ohmic contacts 161 and 165. However, the projections 154 of the semiconductor stripes 151 include a plurality of exposed portions, which are not covered with the data lines 171 and the drain electrodes 175, such as portions located between the source electrodes 173 and the drain electrodes 175.

A passivation layer 180 is formed on the data lines 171, the drain electrodes 175, and exposed portions of the semiconductor stripes 151, which are not covered with the data lines 171 and the drain electrodes 175. The passivation layer 180 is preferably made of photosensitive organic material having a good flatness characteristic, low dielectric insulating material such as a-Si:C:O and a-Si:O:F formed by plasma enhanced chemical vapor deposition (PECVD), or inorganic material such as silicon nitride and silicon oxide.

The passivation layer 180 has a plurality of contact holes 182 and 185 exposing the end portions 179 of the data lines 171 and the drain electrodes 175, respectively. Furthermore, the passivation layer 180 has a plurality of openings 189 exposing the exposed portions of the projections 154 of the semiconductor stripes 151 in the TFTs. The boundary of the exposed portions of the projections 154 substantially coincide with the boundary of the openings 189.

A plurality of pixel electrodes 190 and a plurality of contact assistants 81 and 82, which are preferably made of IZO, are formed on the passivation layer 180.

The pixel electrodes 190 are physically and electrically connected to the drain electrodes 175 through the contact holes 185 such that the pixel electrodes 190 receive the data voltages from the drain electrodes 175.

The pixel electrodes 190 supplied with the data voltages generate electric fields in cooperation with a common electrode (not shown) on another panel (not shown), which reorient liquid crystal molecules in a liquid crystal layer (not shown) disposed therebetween.

A pixel electrode 190 and a common electrode form a liquid crystal capacitor, which stores applied voltages after turn-off of the TFT. An additional capacitor called a "storage capacitor," which is connected in parallel to the liquid crystal capacitor, may be provided for enhancing the voltage storing capacity. The storage capacitors are implemented by overlapping the pixel electrodes 190 with the gate lines 121 adjacent thereto (called "previous gate lines") or with separately provided storage electrodes (not shown). The capacitances of the storage capacitors, i.e., the storage capacitances are increased by increasing overlapping areas or by providing conductors, which are connected to the pixel electrodes 190 and overlap the gate lines 121 or the storage electrodes, under the pixel electrodes 190 for decreasing the distance between the terminals.

The pixel electrodes 190 may overlap the gate lines 121 and the data lines 171 to increase aperture ratio.

The contact assistants 82 are connected to the exposed expansions 179 of the data lines 171 through the contact holes 182 and the contact holes 82 fully cover the exposed expansions 179. The contact assistants 82 protect the exposed portions 179 and complement the adhesion between the exposed portions 179 and external devices.

A plurality of columnar spacers 320 preferably made of photosensitive organic material stand on the exposed portions of the semiconductor stripes 151 and on the passivation layer 180. The spacers 320 sustain a gap between the TFT array panel and the common electrode panel and protect the exposed portions of the semiconductor stripes 151. The spacers 320 may have a dual-layered structure including an inorganic lower film for good contact with the exposed portions of the semiconductor 151 and an organic upper film.

According to another embodiment of the present invention, the pixel electrodes 190 are made of transparent conductive polymer. For a reflective LCD, the pixel electrodes 190 are made of opaque reflective metal. In these cases, the contact assistants 82 may be made of material such as ITO or IZO different from the pixel electrodes 190.

A method of manufacturing the TFT array panel shown in FIGS. 1 and 2 according to an embodiment of the present invention will be now described in detail with reference to FIGS. 3 to 11 as well as FIGS. 1 and 2.

Figure 3:
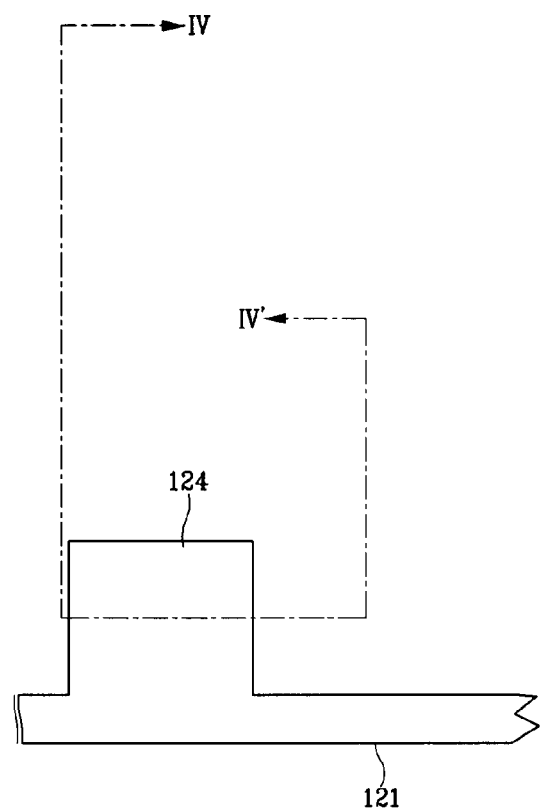
FIG. 3 is a layout view of a TFT array panel shown in FIGS. 1 and 2 in the first step of a manufacturing method thereof according to an embodiment of the present invention.
Figure 4:
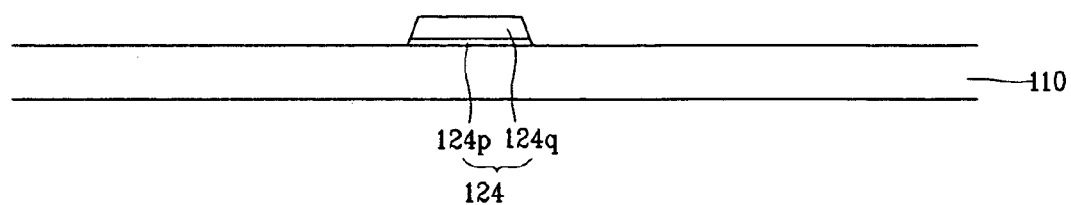
FIG. 4 is a sectional view of the TFT array panel shown in FIG. 3 taken along the line IV-IV'.
Figure 5:
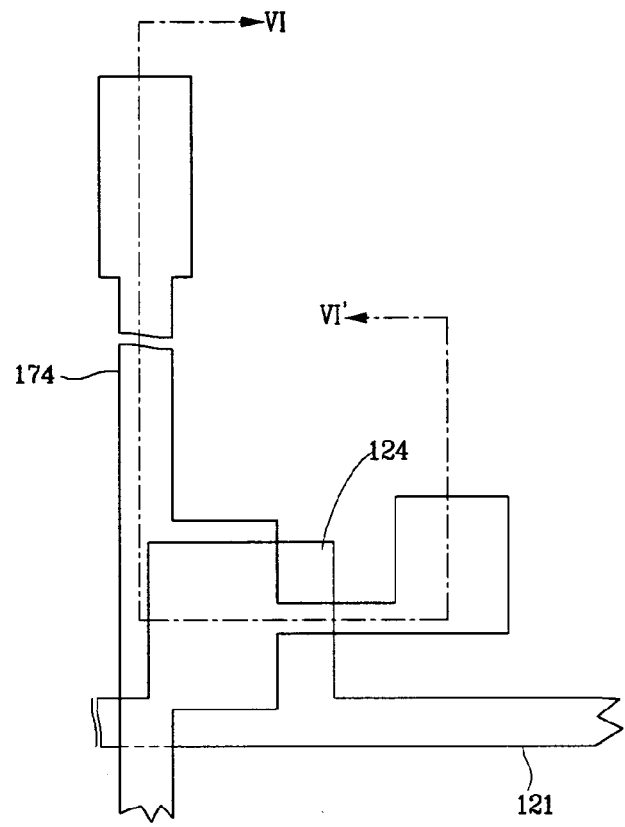
FIG. 5 is a layout view of the TFT array panel in the step following the step shown in FIGS. 3 and 4.
Figure 6:
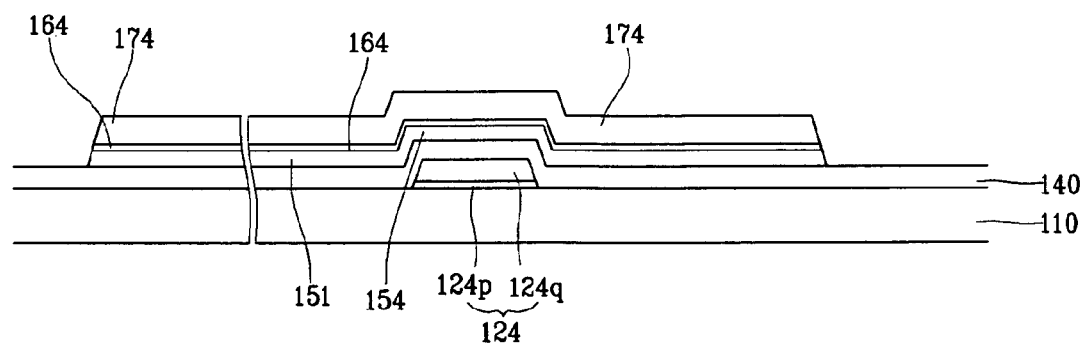
FIG. 6 is a sectional view of the TFT array panel shown in FIG. 5 taken along the line VI-VI'.
Figure 7:
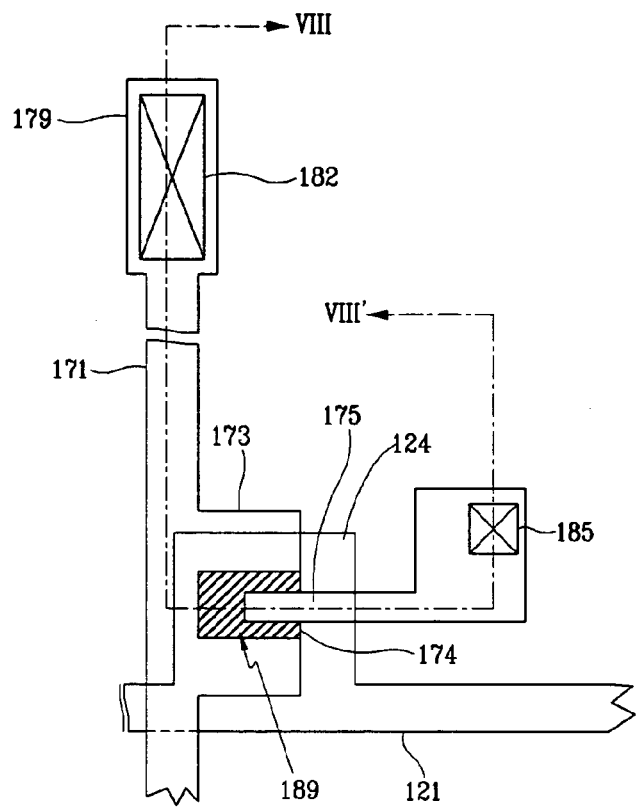
FIG. 7 is a layout view of the TFT array panel in the step following the step shown in FIGS. 5 and 6.
Figure 8:
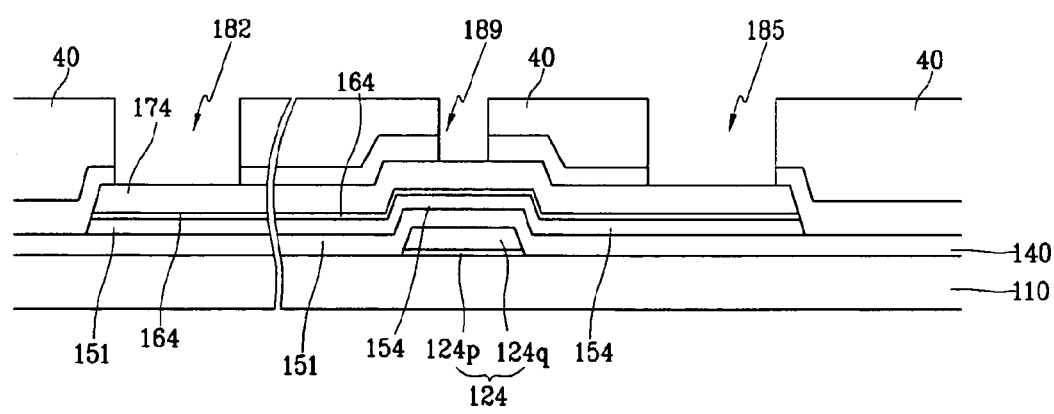
FIG. 8 is a sectional view of the TFT array panel shown in FIG. 7 taken along the line VIII-VIII'.
Figure 9:
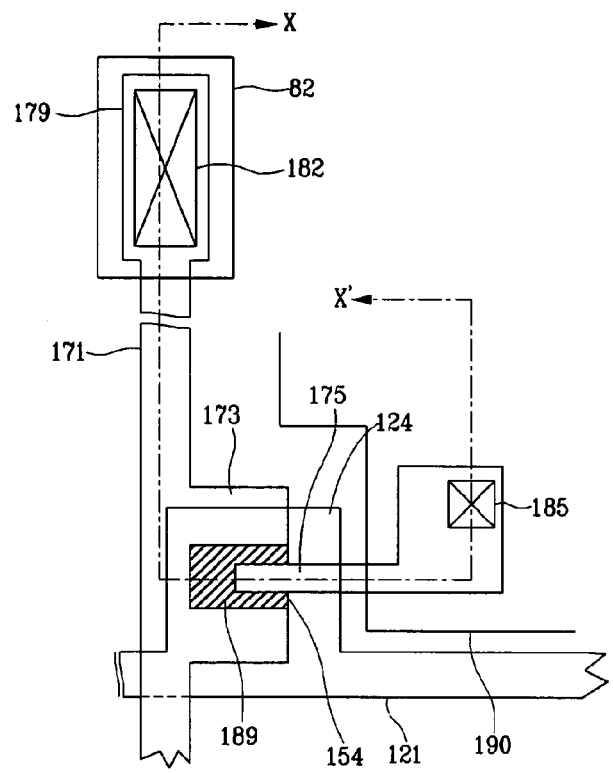
FIG. 9 is a layout view of the TFT array panel in the step following the step shown in FIGS. 7 and 8.
Figure 10:
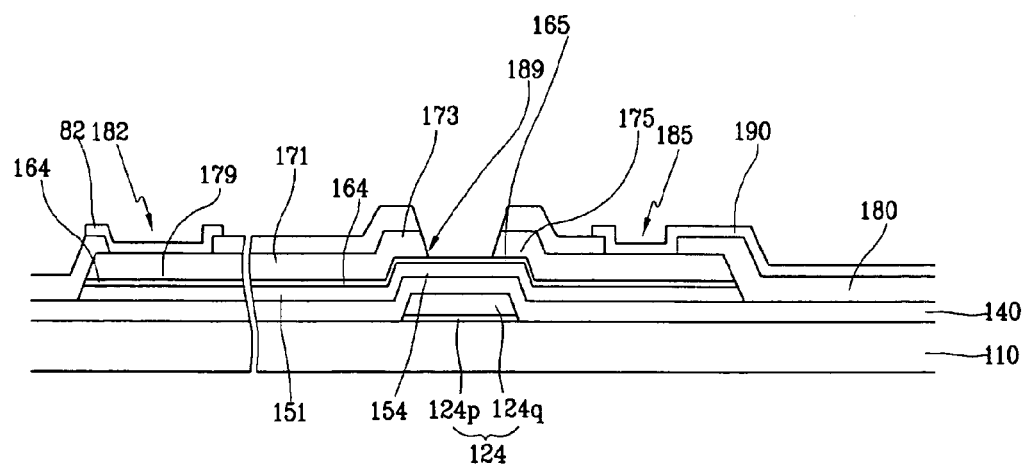
FIG. 10 is a sectional view of the TFT array panel shown in FIG. 9 taken along the line X-X'.
Figure 11:
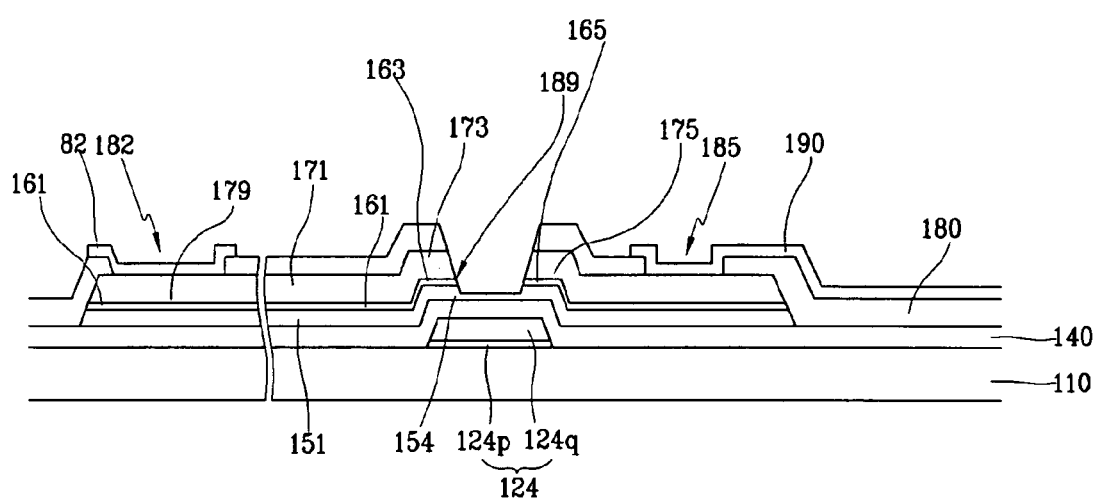
FIG. 11 is a sectional view of the TFT array panel shown in FIG. 9 taken along the line X-X', and illustrate the step following the step shown in FIG. 10.

FIG. 3 is a layout view of a TFT array panel shown in FIGS. 1 and 2 in the first step of a manufacturing method thereof according to an embodiment of the present invention; FIG. 4 is a sectional view of the TFT array panel shown in FIG. 3 taken along the line IV-IV'; FIG. 5 is a layout view of the TFT array panel in the step following the step shown in FIGS. 3 and 4; FIG. 6 is a sectional view of the TFT array panel shown in FIG. 5 taken along the line VI-VI'; FIG. 7 is a layout view of the TFT array panel in the step following the step shown in FIGS. 5 and 6; FIG. 8 is a sectional view of the TFT array panel shown in FIG. 7 taken along the line VIII-VIII'; FIG. 9 is a layout view of the TFT array panel in the step following the step shown in FIGS. 7 and 8; FIG. 10 is a sectional view of the TFT array panel shown in FIG. 9 taken along the line X-X'; and FIG. 11 is a sectional view of the TFT array panel shown in FIG. 9 taken along the line X-X', and illustrate the step following the step shown in FIG. 10.

Referring to FIGS. 3 and 4, a plurality of gate lines 121 including a plurality of gate electrodes 124 are formed on an insulating substrate 110 such as transparent glass. The gate lines 121 include two conductive films, a lower conductive film preferably made of Cr and having a thickness of about 500 Å and an upper conductive film preferably made of Al or Al alloy and having a thickness of about 1,000-3,000 Å, preferably about 2,500 Å. The lower and upper films of the gate electrodes 124 are indicated by 124*p* and 124*q*, respectively, in FIG. 4.

Referring to FIGS. 5 and 6, a gate insulating layer 140, an intrinsic a-Si layer, an extrinsic a-Si layer, and a conductive layer preferably made of Cr are deposited in sequence by CVD and sputtering and the conductive layer, the extrinsic a-Si layer, and the intrinsic a-Si layer are photo-etched to form a plurality of conductors 174, a plurality of extrinsic semiconductor stripes 164, and a plurality of intrinsic semiconductor stripes 151 including a plurality of projections 154 on the gate insulating layer 140.

The gate insulating layer 140 is preferably made of silicon nitride with thickness of about 2,000 Å to about 5,000 Å, and the deposition temperature is preferably in a range of about 250° C. and about 500° C. The intrinsic a-Si layer and the extrinsic a-Si layer have thickness of about 500-600 Å. The conductive layer preferably has a thickness of about 1,000-3,000 Å, preferably about 2,500 Å.

Referring to FIGS. 7 and 8, a passivation layer 180 preferably having a thickness larger than about 3,000 Å is deposited and a photoresist 40 is formed. The passivation layer 180 are etched using the photoresist 40 as an etch mask to form a plurality of contact holes 182 and 185 and a plurality of openings 189 exposing portions of the conductors 174.

Referring to FIGS. 9 and 10, an IZO layer having a thickness of about 400-500 Å is sputtered. An example of commercially available sputtering target for IZO is IDIXO (indium x-metal oxide) produced by Idemitsu in Japan. The sputtering target may include $In_2O_3$ and ZnO and the content of Zn among In and Zn preferably ranges about 15-20 atomic %. In addition, the sputtering temperature for Zn is preferably lower than about 250° C. Thereafter, a photoresist (not shown) is formed and the TFT array panel is subjected to wet etch condition with an etchant for Cr, which can also etch IZO such that a plurality of pixel electrodes 190 and a plurality of contact assistants 82 covering the exposed portions of the conductors 174 through the contact holes 182 and 185 are formed and, simultaneously, the exposed portions of the conductors 174 through the openings 189 are removed to form a plurality of data lines 171 including source electrodes 173 and end portions 179 and a plurality drain electrodes 175 and to expose portions of the extrinsic semiconductor stripes 164. Any Cr etchant containing $Ce(NH_4)_2(NO_3)_6$ can be used in this step.

Referring to FIG. 11, the exposed portions of the extrinsic semiconductor stripes 164, which are not covered with the data lines 171 and the drain electrodes 175, are removed by blanket etch to complete a plurality of ohmic contact stripes 161 including a plurality of projections 163 and a plurality of ohmic contact islands 165 and to expose portions of the intrinsic semiconductor stripes 151.

Oxygen plasma treatment may follow thereafter in order to stabilize the exposed surfaces of the semiconductor stripes 151.

Finally, a plurality of columnar spacers 320 are formed on the exposed portions of the semiconductor stripes 151 as shown in FIGS. 1 and 2. The columnar spacers 320 may be made of photosensitive material and this can simplify the process since the thickness of the photosensitive film can be adjusted by controlling rotational speed of a spin coating device.

A driving circuit for generating the gate signals may be also formed on the substrate 110 and connected to the gate lines 121.

The above-describe method separates the source electrodes 173 and the drain electrodes 175 using the passivation layer 180, the contact assistants 82, and the pixel electrodes 190, thereby reducing the number of photolithography steps. In addition, the exposed portions of the conductors 174 are removed along with the formation of the pixel electrodes 190 and the contact assistants 82. Accordingly, the manufacturing method is simplified to reduce the production cost and the productivity.

A TFT array panel for an LCD according to another embodiment of the present invention will be described in detail with reference to FIGS. 12, 13A and 13B.

Figure 12:
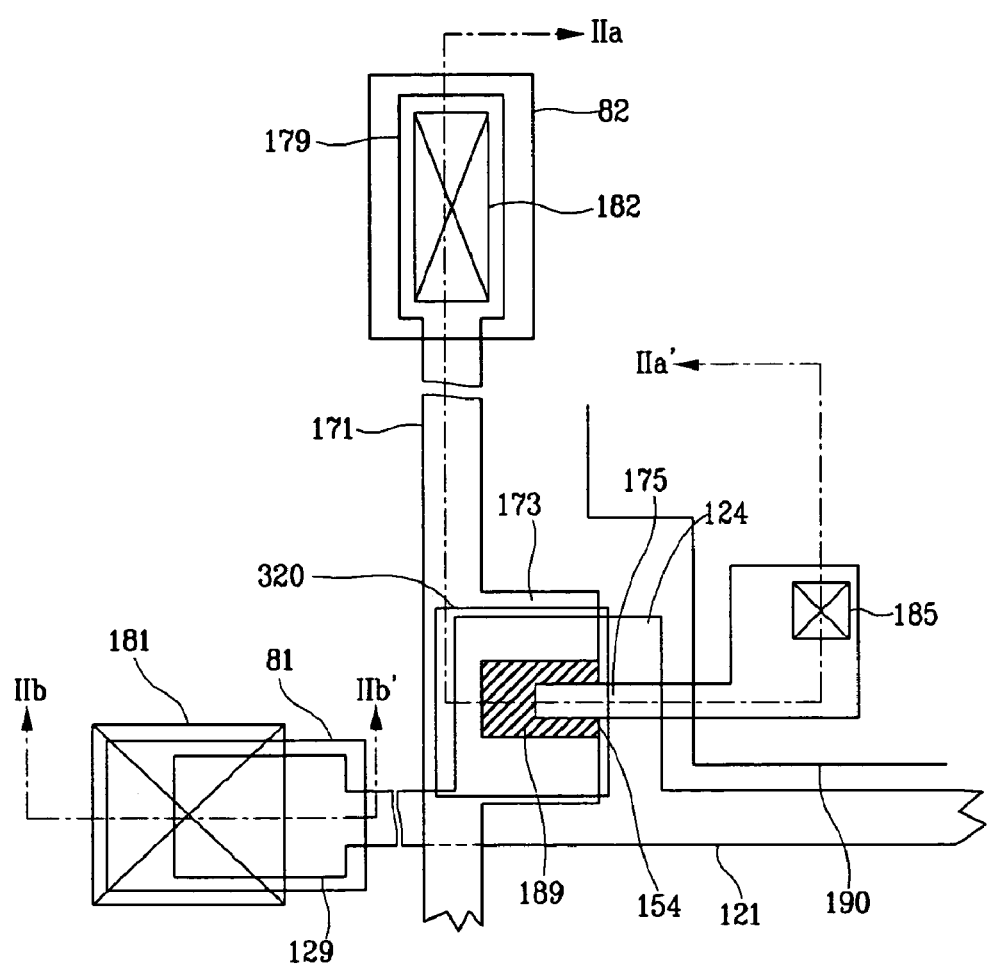
FIG. 12 is a layout view of a TFT array panel for an LCD according to another embodiment of the present invention.
Figure 13A:
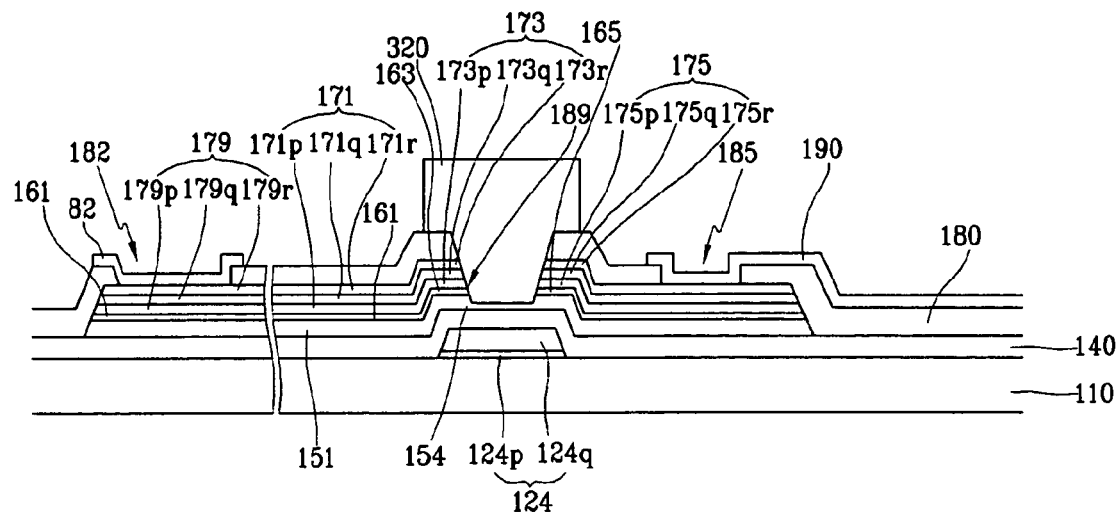
FIG. 13A is a sectional view of the TFT array panel shown in FIG. 12 taken along the line XIIa-XIIa'.
Figure 13B:
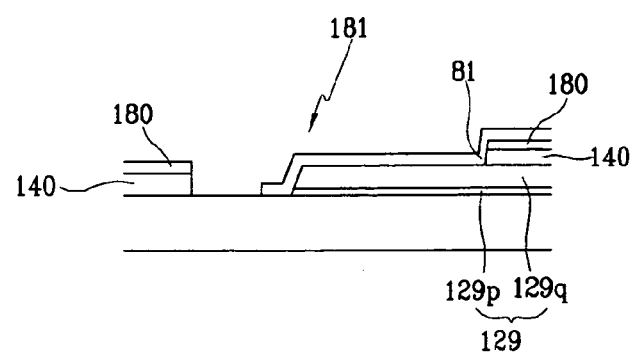
FIG. 13B is a sectional view of the TFT array panel shown in FIG. 12 taken along the lines XIIb-XIIb'.

FIG. 12 is a layout view of a TFT array panel for an LCD according to another embodiment of the present invention, FIG. 13A is a sectional view of the TFT array panel shown in FIG. 12 taken along the line XIIa-XIIa', and FIG. 13B is a sectional view of the TFT array panel shown in FIG. 12 taken along the lines XIIb-XIIb'.

Referring to FIGS. 12-13B, a layered structure of the TFT array panel according to this embodiment is almost the same as those shown in FIGS. 1 and 2.

That is, a plurality of gate lines 121 including a plurality of gate electrodes 124 are formed on a substrate 110, and a gate insulating layer 140, a plurality of semiconductor stripes 151 including a plurality of projections 154, and a plurality of ohmic contact stripes 161 including a plurality of projections 163 and a plurality of ohmic contact islands 165 are sequentially formed thereon. A plurality of data lines 171 including a plurality of source electrodes 173 and end portions 179 and a plurality of drain electrodes 175 are formed on the ohmic contacts 161 and 165, and a passivation layer 180 are formed thereon. A plurality of contact holes 182 and 185 and a plurality of openings 189 are provided at the passivation layer 180 and the gate insulating layer 140, and a plurality of pixel electrodes 190 and a plurality of contact assistants 82 are formed on the passivation layer 180. A plurality of columnar spacers 320 are formed on the openings 189.

Different from the TFT array panel shown in FIGS. 1 and 2, the gate lines 121 of the TFT array panel according to this embodiment have a dual-layered structure including a low resistivity lower film of such as Al or Al alloy and a good contact upper film of such as Mo or Mo alloy. In FIGS. 13A and 13B, the lower and upper films of the gate electrodes 124 are indicated by reference numerals 124*p* and 124*q*, respectively, and the lower and upper films of end portions 129 of the gate lines 121 are indicated by reference numerals 129*p* and 129*q*, respectively.

In addition, the data lines 171 and the drain electrodes 175 have a triple-layered structure including a lower film 171*p* and 175*q*, an intermediate film 171*q* and 175*q*, and an upper film 171*r* and 175*r*. The lower film 171*p* and 175*q* and the upper film 171*r* and 175*r* are preferably made of material such as Cr, Mo, Mo alloy, which has good physical, chemical, and electrical contact characteristics with other materials. The intermediate film 171*q* and 175*q* is preferably made of low resistivity metal including Al containing metal. Good examples are a lower Mo or Mo alloy film, an intermediate Al (or Al alloy) film, and an upper Mo or Mo alloy film, which are etched under the same etch condition. In FIG. 13A, the lower, intermediate, and the upper films of the source electrodes 173 are indicated by reference numerals 173*p*, 173*q* and 173*r*, respectively, and the lower, intermediate, and upper films of the end portions 179 of the data lines 171 are indicated by reference numerals 179*p*, 179*q* and 179*r*, respectively.

Furthermore, the passivation layer 180 and the gate insulating layer 140 have a plurality of contact holes 181 exposing the end portions 129 of the gate lines 121 and a plurality of contact assistants 81 contacting to the end portions 129 of the gate lines 121 through the contact holes 181 are formed on the passivation layer 180. The contact holes 181 further expose edges of the end portions 129 of the gate lines 121 and some portions of the substrate 110, and the contact assistants 181 contacts the substrate 110.

The contact holes 182 and 185 may also expose edges of the end portions of the data lines 171 and the drain electrodes 175.

Moreover, the pixel electrodes 190 and the contact assistants 181, 182 and 185 are preferably made of ITO.

Many of the above-described features of the TFT array panel for an LCD shown in FIGS. 1 and 2 may be appropriate to the TFT array panel shown in FIGS. 12-13B.

Now, a method of manufacturing the TFT array panel shown in FIGS. 12-13B will be described in detail with reference to FIGS. 14-22B as well as FIGS. 12-13B.

Figure 14:
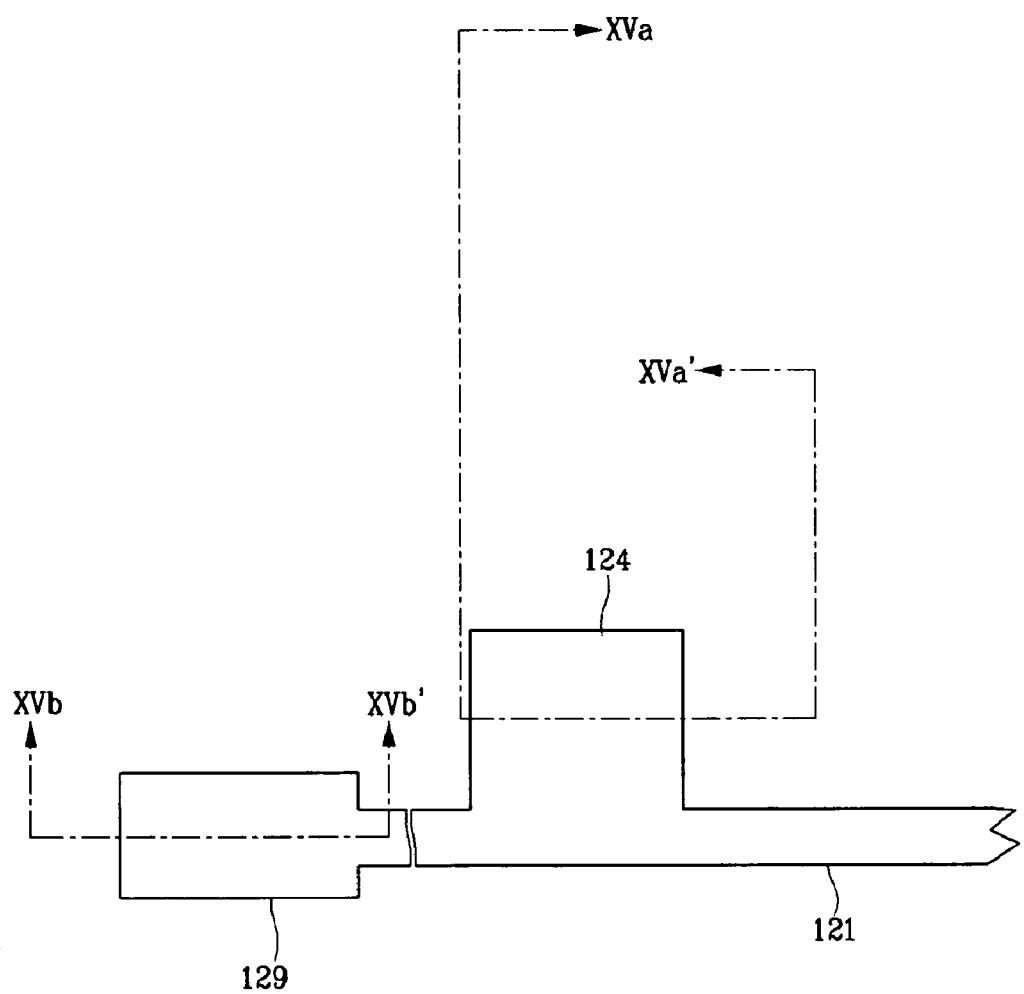
FIG. 14 is a layout view of a TFT array panel shown in FIGS. 12-13B in the first step of a manufacturing method thereof according to an embodiment of the present invention.
Figure 15A:
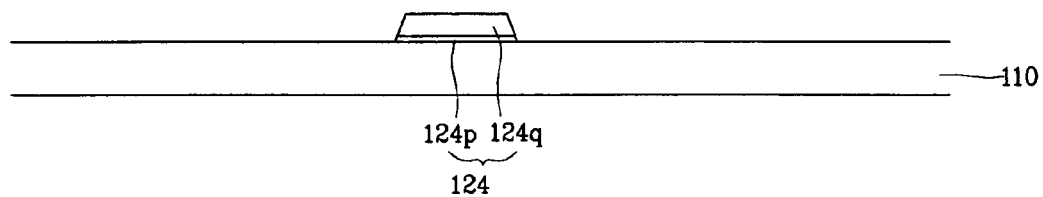
FIGS. 15A and 15B are sectional views of the TFT array panel shown in FIG. 14 taken along the lines XVa-XVa' and XVb-XVb', respectively.
Figure 15B:
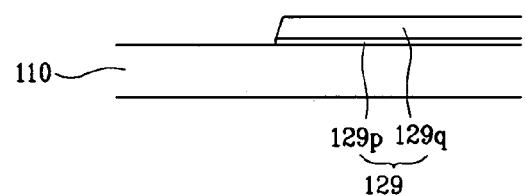
Figure 16:
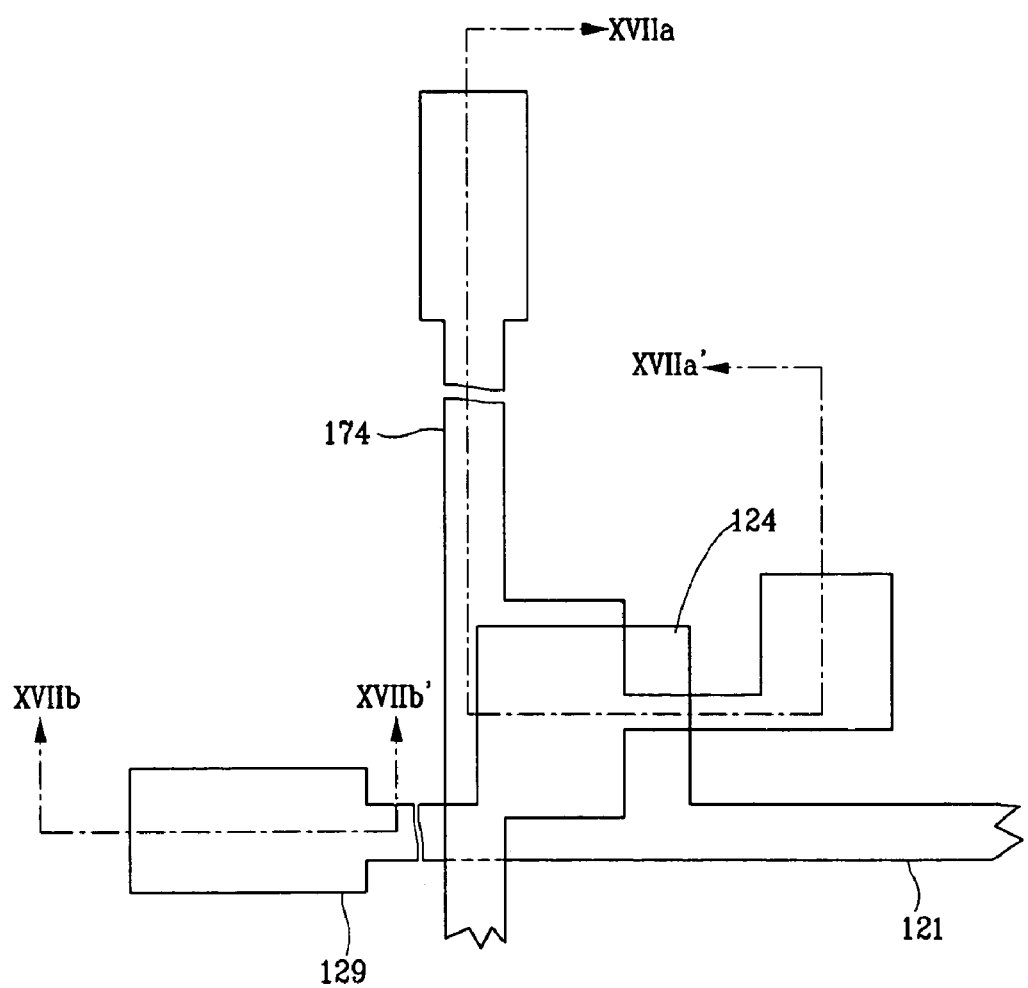
FIG. 16 is a layout view of the TFT array panel in the step following the step shown in FIGS. 14-15B.
Figure 17A:
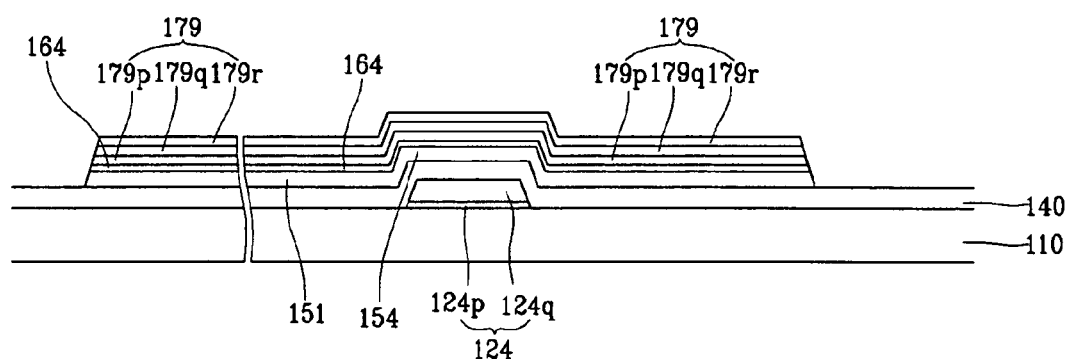
FIGS. 17A and 17B are sectional views of the TFT array panel shown in FIG. 16 taken along the lines XVIIa-XVIIa' and XVIIb-XVIIb', respectively.
Figure 17B:
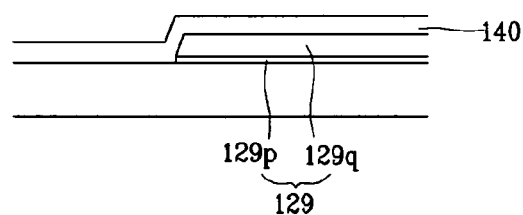
Figure 18:
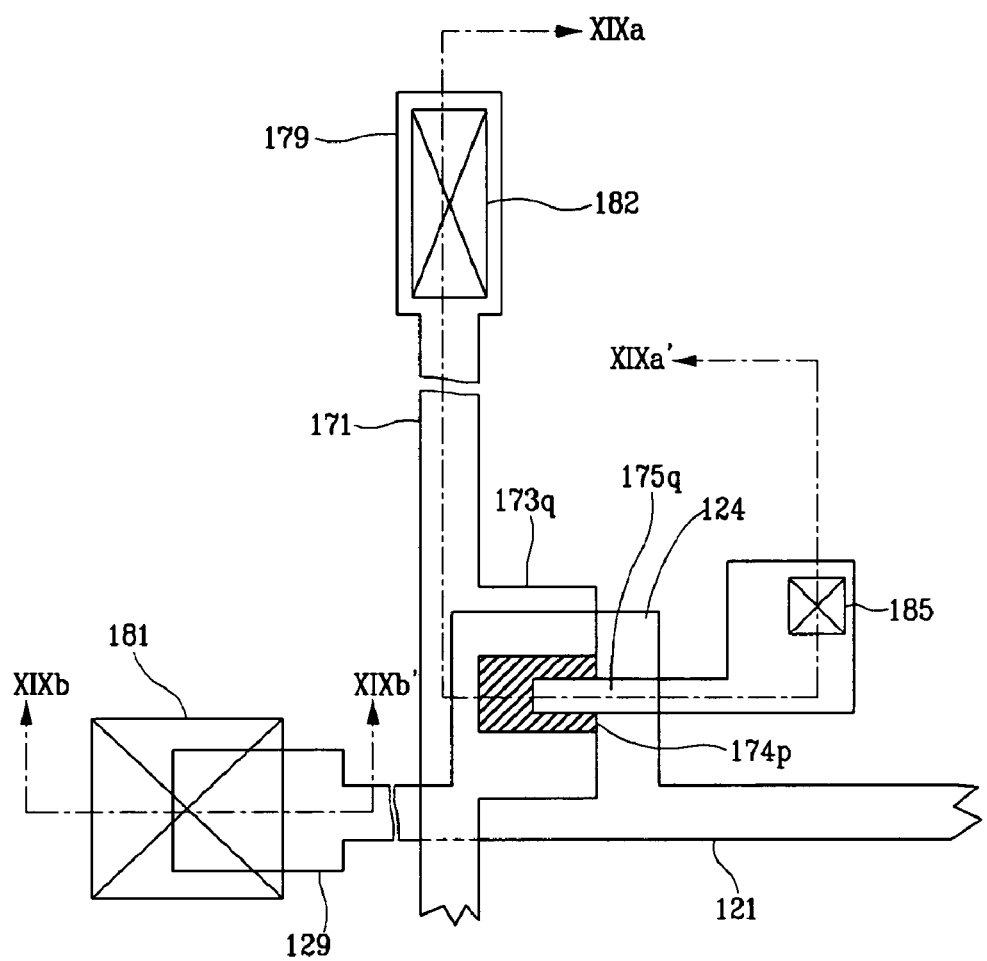
FIG. 18 is a layout view of the TFT array panel in the step following the step shown in FIGS. 16-17B.
Figure 19A:
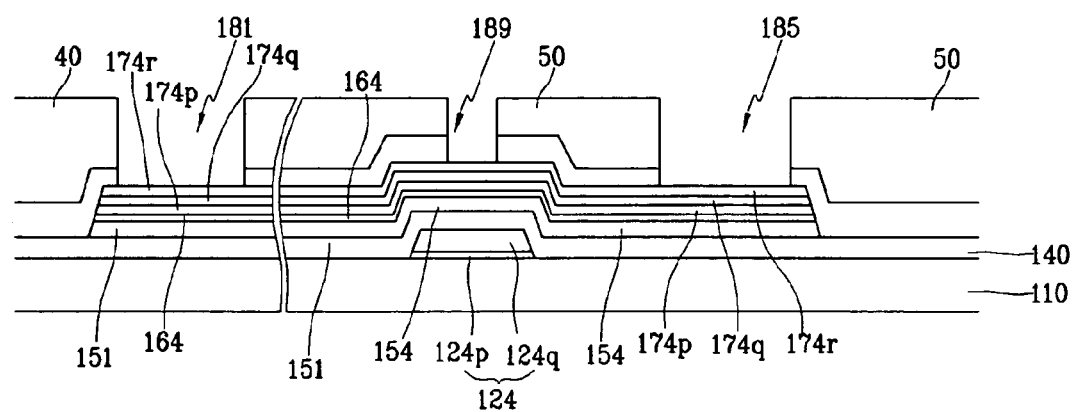
FIGS. 19A and 19B are sectional views of the TFT array panel shown in FIG. 18 taken along the lines XXa-XXa', respectively.
Figure 19B:
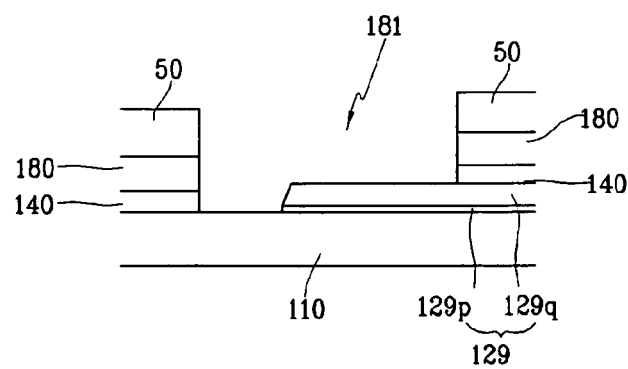
Figure 20:
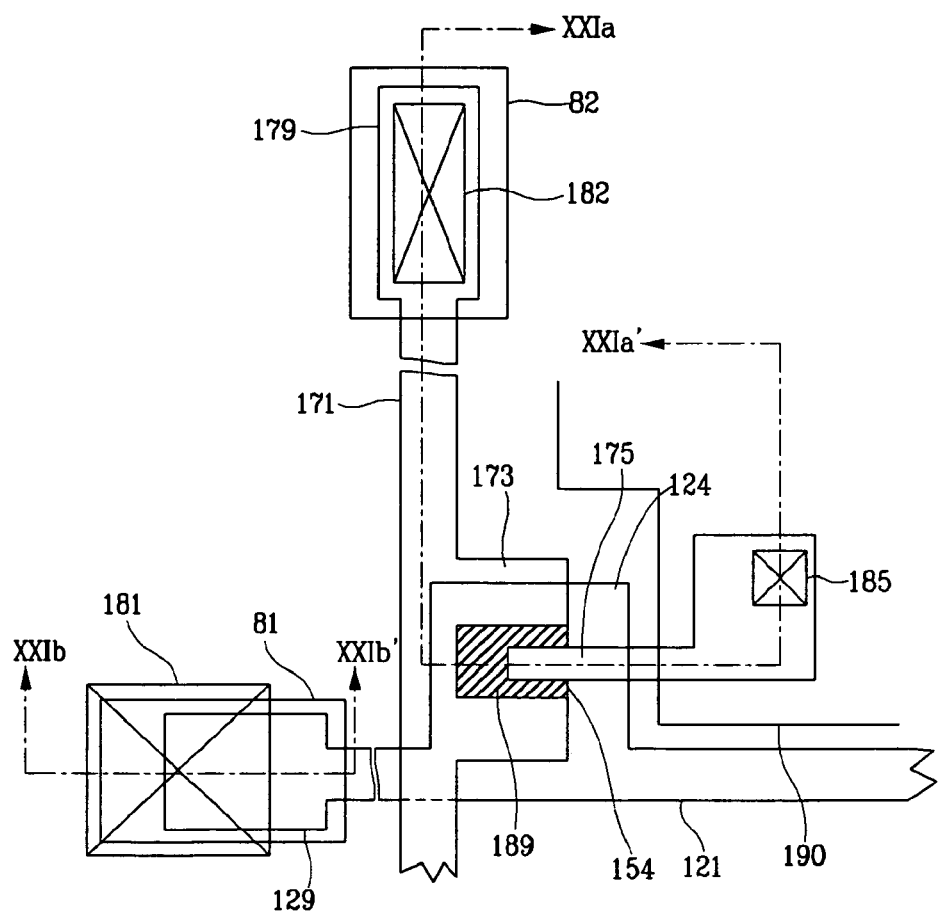
FIG. 20 is a layout view of the TFT array panel in the step following the step shown in FIGS. 18-19B.
Figure 21A:
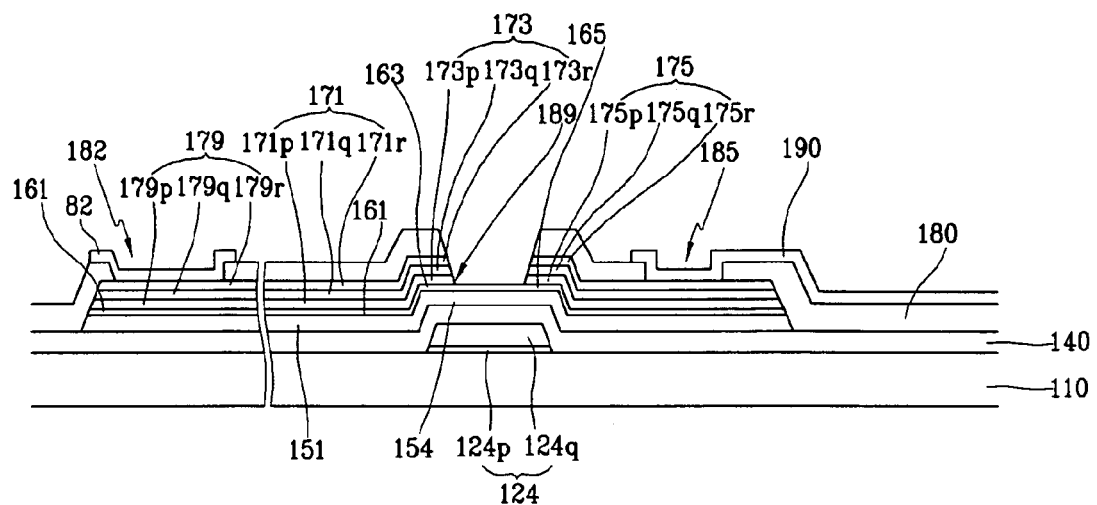
FIGS. 21A and 21B are sectional views of the TFT array panel shown in FIG. 20 taken along the lines XXIa-XXIa' and XXIb-XXIb', respectively.
Figure 21B:
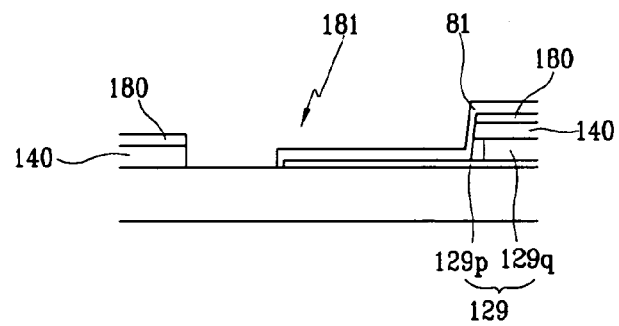
Figure 22A:
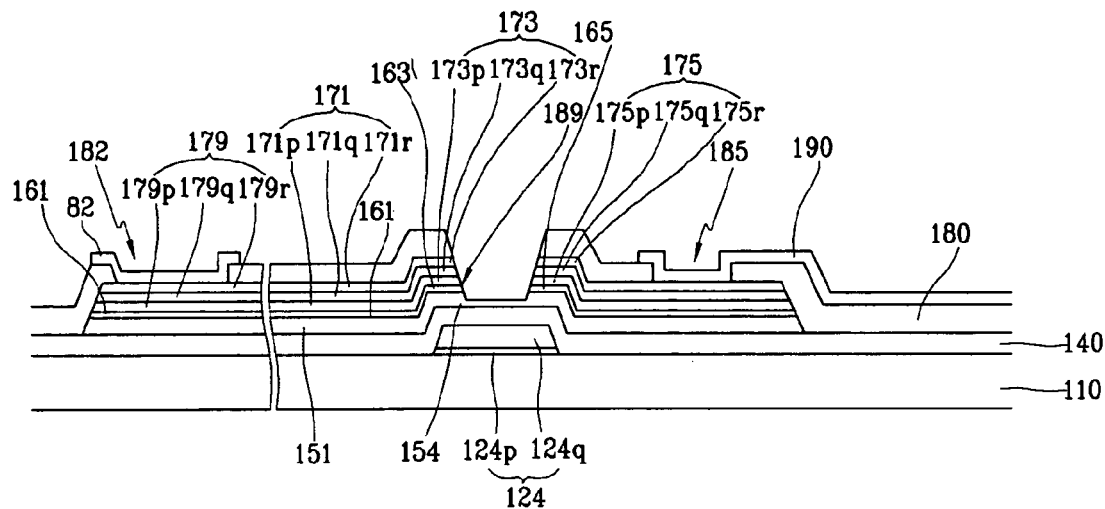
FIGS. 22A and 22B is a sectional view of the TFT array panel shown in FIG. 20 taken along the lines XXIa-XXIa' and XXIb-XXIb', respectively, and illustrate the step following the step shown in FIGS. 21A and 21B.
Figure 22B:
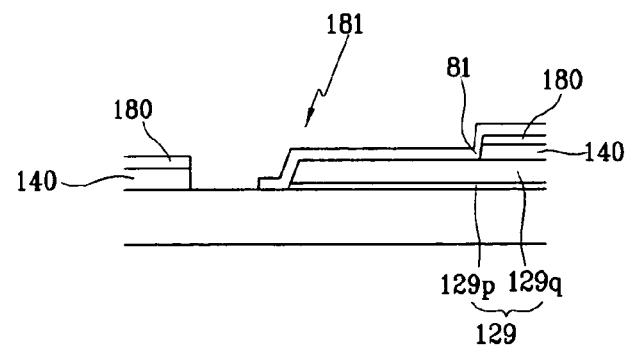

FIG. 14 is a layout view of a TFT array panel shown in FIGS. 12-13B in the first step of a manufacturing method thereof according to an embodiment of the present invention; FIGS. 15A and 15B are sectional views of the TFT array panel shown in FIG. 14 taken along the lines XVa-XVa' and XVb-XVb', respectively; FIG. 16 is a layout view of the TFT array panel in the step following the step shown in FIGS. 14-15B; FIGS. 17A and 17B are sectional views of the TFT array panel shown in FIG. 16 taken along the lines XVIIa-XVIIa' and XVIIb-XVIIb', respectively; FIG. 18 is a layout view of the TFT array panel in the step following the step shown in FIGS. 16-17B; FIGS. 19A and 19B are sectional views of the TFT array panel shown in FIG. 18 taken along the lines XXa-XXa', respectively; FIG. 20 is a layout view of the TFT array panel in the step following the step shown in FIGS. 18-19B; FIGS. 21A and 21B are sectional views of the TFT array panel shown in FIG. 20 taken along the lines XXIa-XXIa' and XXIb-XXIb', respectively; and FIGS. 22A and 22B is a sectional view of the TFT array panel shown in FIG. 20 taken along the lines XXIa-XXIa' and XXIb-XXIb', respectively, and illustrate the step following the step shown in FIGS. 21A and 21B.

Referring to FIGS. 14-15B, a plurality of gate lines 121 including a plurality of gate electrodes 124 are formed on an insulating substrate 110 such as transparent glass. The gate lines 121 include two conductive films, a lower conductive film preferably made of Al and an upper conductive film preferably made of Mo. The lower and upper films of the gate electrodes 124 are indicated by 124p and 124q, respectively, in FIGS. 15A and 15B. The upper and lower films of the gate lines 121 can be simultaneously etched by using an Al etchant to have a tapered edge profile.

Referring to FIGS. 16-17B, a gate insulating layer 140, an intrinsic a-Si layer, an extrinsic a-Si layer, and a conductive layer including lower, intermediate, and upper films are deposited in sequence by CVD and sputtering and the conductive layer, the extrinsic a-Si layer, and the intrinsic a-Si layer are photo-etched to form a plurality of conductors 174 including lower, intermediate, and upper conductors 174p, 174p and 174r, a plurality of extrinsic semiconductor stripes 164, and a plurality of intrinsic semiconductor stripes 151 including a plurality of projections 154 on the gate insulating layer 140.

The lower and upper conductors 174p and 174r are preferably made of Mo or Mo alloy having a thickness of about 500 Å, and the intermediate conductor 174q is preferably made of Al or Al alloy having a thickness of about 1,000-3,000 Å, preferably about 2,500 Å. A sputtering target for Al preferably includes pure Al or Al—Nd alloy containing 2 atomic % Nd, and a sputtering temperature is preferably about 150 degrees.

Referring to FIGS. 18-19B, a passivation layer 180 preferably having a thickness larger than about 3,000 Å is deposited and a photoresist 50 is formed. The passivation layer 180 are etched using the photoresist 50 as an etch mask to form a plurality of contact holes 181, 182 and 185 and a plurality of openings 189 exposing end portions 129 of the gate lines and portions of the upper conductors 174r.

Referring to FIGS. 20-21B, an ITO layer having a thickness of about 400-500 Å is sputtered. Thereafter, a photoresist (not shown) is formed and the TFT array panel is subjected to wet etch condition with an etchant for ITO, which can also etch Al and Mo (alloy) such that a plurality of pixel electrodes 190 and a plurality of contact assistants 81 and 82 covering the exposed portions of the conductors 174 through the contact holes 181, 182 and 185 are formed and, simultaneously, the exposed portions of the conductors 174 through the openings 189 are removed to form a plurality of data lines 171 including source electrodes 173 and end portions 179 and a plurality drain electrodes 175 and to expose portions of the extrinsic semiconductor stripes 164. Any etchant for Al containing $HNO_3$, $H_3PO_4$, and $CH_3COOH$ can be used in this step.

Referring to FIGS. 22A and 22B, the exposed portions of the extrinsic semiconductor stripes 164, which are not covered with the data lines 171 and the drain electrodes 175, are removed by blanket etch to complete a plurality of ohmic contact stripes 161 including a plurality of projections 163 and a plurality of ohmic contact islands 165 and to expose portions of the intrinsic semiconductor stripes 151.

Oxygen plasma treatment may follow thereafter in order to stabilize the exposed surfaces of the semiconductor stripes 151.

Finally, a plurality of columnar spacers 320 are formed on the exposed portions of the semiconductor stripes 151 as shown in FIGS. 12-13B.

The above-describe method also separates the source electrodes 173 and the drain electrodes 175 using the passivation layer 180, the contact assistants 81 and 82, and the pixel electrodes 190, thereby reducing the number of photolithography steps. In addition, the exposed portions of the conductors 174 are removed along with the formation of the pixel electrodes 190 and the contact assistants 81 and 82. Accordingly, the manufacturing method is simplified to reduce the production cost and the productivity.

In the meantime, the gate lines 121 or the data lines 171 may include a Cr or Mo lower film and an Al upper film. In this case, exposed portions of the gate lines 121 or the data lines 171 through the contact holes 181, 182 and 185 may be removed by blanket etch.

As described above, the embodiments of the present invention reduce the number of the photolithography steps by separating the source electrodes and the drain electrodes using the passivation layer, the contact assistants, and the pixel electrodes. Accordingly, the manufacturing method is simplified to reduce the production cost and the productivity.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A method of manufacturing a thin film transistor array panel, the method comprising:
   forming a gate line on a substrate;
   depositing a gate insulating layer and a semiconductor layer in sequence on the gate line;
   depositing a first conductive layer on the semiconductor layer;
   photo-etching the first conductive layer and the semiconductor layer;
   depositing a passivation layer;
   photo-etching the passivation layer to form contact holes and openings which expose first and second portions of the first conductive layer;
   depositing a second conductive layer; and
   etching the second and the first conductive layers to simultaneously form a pixel electrode on the first portion of the first conductive layer and to remove the second portion of the first conductive layer.

2. The method of claim 1, wherein the etch of the second and the first conductive layers comprises wet etch with an etchant.

3. The method of claim 2, wherein the first conductive layer comprises Cr.

4. The method of claim 3, wherein the second conductive layer comprises IZO.

5. The method of claim 2, wherein the first conductive layer comprises Al or Mo.

6. The method of claim 5, wherein the first conductive layer comprises a first film of Mo or Mo alloy and a second film of Al or Al alloy.

7. The method of claim 5, wherein the first conductive layer comprises a lower film of Mo or Mo alloy, an intermediate film of Al or Al alloy, and an upper film of Mo or Mo alloy.

8. The method of claim 5, wherein the second conductive layer comprises ITO.

9. The method of claim 1, wherein the photo-etching of the passivation layer exposes a third portion of the first conductive layer.

10. The method of claim 9, wherein the etch of the second and the first conductive layers forms a contact assistant on the third portion of the first conductive layer.

11. The method of claim 1, wherein the photoetching of the passivation layer etches the gate insulating layer to expose a portion of the gate line.

12. The method of claim 11, wherein the etch of the second and the first conductive layers forms a contact assistant on the exposed portion of the gate line.

13. The method of claim 1, wherein the gate line comprises a lower film and an upper film.

14. The method of claim 13, wherein the photo-etching of the passivation layer etches the gate insulating layer to expose a portion of the upper film of the gate line.

15. The method of claim 14, further comprising:
   removing the exposed portion of the upper film of the gate line.

16. The method of claim 1, wherein the etch of the second and the first conductive layers exposes a portion of the semiconductor layer and the method further comprises:
   forming: a columnar spacer covering the exposed portion of the semiconductor layer.

17. The method of claim 16, wherein the spacer comprises organic or inorganic material.

18. The method of claim 1, wherein the semiconductor layer comprises an intrinsic film and an extrinsic film, and
   the method further comprises: removing the exposed portion of the extrinsic film after removing the second portion of the first conductive layer.

* * * * *